United States Patent [19]

Broyde

[11] Patent Number: 4,794,353
[45] Date of Patent: Dec. 27, 1988

[54] DISSIPATIVE LOW-PASS FILTER

[75] Inventor: Frédéric Broyde, St. Martin d'Heres, France

[73] Assignee: Merlin Gerin, Grenoble Cedex, France

[21] Appl. No.: 137,947

[22] Filed: Dec. 28, 1987

[30] Foreign Application Priority Data

Jan. 28, 1987 [FR] France .................. 87 01178

[51] Int. Cl.$^4$ ............ H03H 7/06; H03H 7/075
[52] U.S. Cl. ......................... 333/167; 333/12; 333/81 R; 333/168
[58] Field of Search ............ 333/12, 81 R, 167, 168, 333/172, 175–177, 181

[56] References Cited

U.S. PATENT DOCUMENTS 4,104,600 8/1978 Mayer .................. 333/181

FOREIGN PATENT DOCUMENTS 2101425 1/1983 United Kingdom .

OTHER PUBLICATIONS

J. P. Becker, No. 2, Feb. 1977, pp. 77–80, "Archiv fur Elektronik und Ubertragungstechnik".
R. J. Helmer et al., vol. 50, 1967, pp. 343–345, "Nuclear Instruments and Methods".
G. E. Owen et al., "Fundamentals of Electronics", vol. 1, pp. 167, 174.
IEEE Transactions on Magnetics, vol. MAG-7, No. 3, Sep. 1971, pp. 584–585.

Primary Examiner—Marvin L. Nussbaum
Attorney, Agent, or Firm—Parkhurst, Oliff & Berridge

[57] ABSTRACT

The filter comprises a series branch formed by an inductance coil (L) in parallel with a resistor (R1) and a parallel branch formed by a capacitor (C) in series with a resistor (Rc). For frequencies such that $Rc >> 1/\omega C$ and $R1 << \omega L$, the ratio between the output and input powers of the filter has a predetermined maximum value strictly lower than 1 and independent of the load impedance.

3 Claims, 2 Drawing Sheets

DISSIPATIVE LOW-PASS FILTER

BACKGROUND OF THE INVENTION

The invention relates to a dissipative low-pass filter, more particularly for filtering power lines.

It is well-known that conventional non-dissipative low-pass filters, although they give satisfaction when the source and load impedances are fixed, generally speaking 50 Ohms, are not suitable for filtering power supply lines in which the impedance at high frequencies is not known and may vary.

It has already been proposed, in this case, to replace non-dissipative filters by dissipative filters or by active, complex filters. State-of-the-art dissipative filters are filters introducing losses in one of the branches of the filter. The introduction of losses in the inductive series branch of the filter, whether it be by use of the skin effect or by a dispersion in the magnetic material making up the inductance coil, has proved ineffective for frequencies lower than 5 MHz. Fitting a resistor in parallel on the inductance coil or a resistor in series with the capacitor does not solve the problem of load or source impedances either, as will be explained in more detail with reference to FIGS. 1 and 2.

SUMMARY OF THE INVENTION

The object of the invention is to achieve a dissipative low-pass filter, of the passive type, using very simple means and enabling a predetermined minimum attenuation to be guaranteed, independent from the source and load impedances, for high frequencies in relation to the cutoff frequency of the filter.

As an example, a filter according to the invention, designed to let the mains frequency (50 or 60 Hz) pass, enables this predetermined minimum attenuation to be achieved, for example at least 10 dB, for frequencies over 10 kHz.

The filter according to the invention comprises a first series branch, located between a first input and a first output and formed by an inductance coil in parallel with a first resistor, and a second parallel branch, located between the first output and a second output, itself connected to a second input, and formed by a capacitor fitted in series with a second resistor, the values of the inductance coil L, of the capacitor C and of the resistors R1 and Rc respectively in parallel with the inductance coil and in series with the capacitor being chosen in such a way that the minimum attenuation M of the filter, given by the relation $$M = -10 \log_{10}\left[1 - \frac{2R1}{Rc}\left(\sqrt{1 + \frac{Rc}{R1}} - 1\right)\right],$$

is fixed at a predetermined value and that, for an angular frequency $\omega_o$, above which the filter must present said minimum attenuation, we have $$Rc >> \frac{1}{\omega_o C} \text{ and } R1 << \omega_o L,$$

the values of L and C moreover defining the characteristics of the filter inside the pass band.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
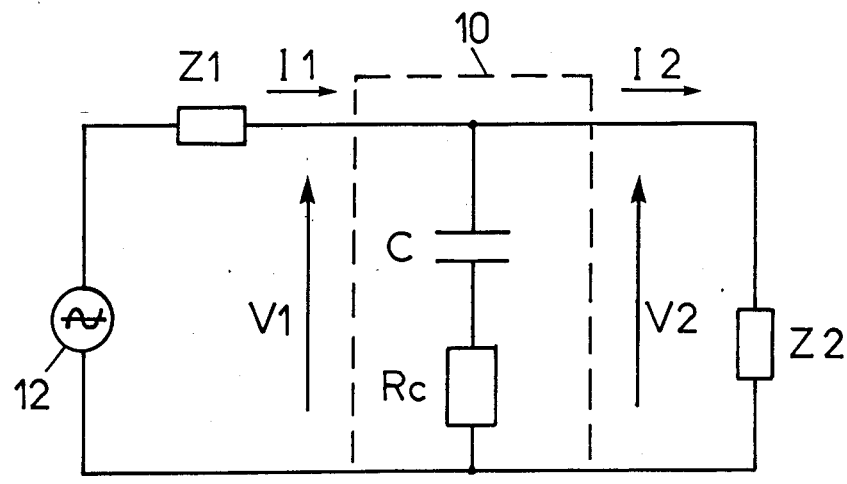
FIG. 1 represents a first type of dissipative low-pass filter.

The dissipative low-pass filter 10, represented in FIG. 1, is made up of a parallel branch RC, formed by a capacitor C in series with a resistor Rc, fitted in parallel with the load impedance Z2. The source impedance, connected in series with the A.C. voltage supply 12, has been represented by Z1.

If V1 is the voltage at the filter input, V2 the voltage at the filter output, and I1 and I2 respectively the input and output currents of the filter, the active powers P1 at the input and P2 at the output of the filter are respectively given by:

$$P1 = Re(V1, \overline{I1}) \tag{1}$$

$$P2 = Re(V2, \overline{I2}) \tag{2}$$

The real part of Z1 will be designated by R1: $R1 = Re(Z1)$, and the real part of Z2 by R2: $R2 = Re(Z2)$.

The imaginary part of Z1 will be designated by X1: $X1 = Im(Z1)$, and the imaginary part of Z2 by X2: $X2 = Im(Z2)$.

It can be shown that for high frequencies in relation to the cutoff frequency of the filter, when $Rc >> 1/\omega C$, the ratio between the output power and the input power is given by:

$$\frac{P2}{P1} \leq \frac{Rc}{Rc + R2} \tag{3}$$

We also have:

$$\frac{Rc\,R2}{Rc + R2} \leq R3 \leq Rc \text{ and} \tag{4}$$

$$0 \leq |X3| \leq Inf\left(\frac{Rc^2}{2(Rc + R2)}, \frac{|X2|\,Rc^2}{(Rc + R2)^2}\right)$$

in which R3 and X3 are the real and imaginary parts of Z3, the input impedance of the filter seen by the generator, i.e.: $Z3 = V1/I1$.

If the load impedance Z2 can take any value having a positive real part (R2), i.e. any physically possible value, it can be seen that for high frequencies the ratio P1/P1 may reach the value 1.

Figure 2:
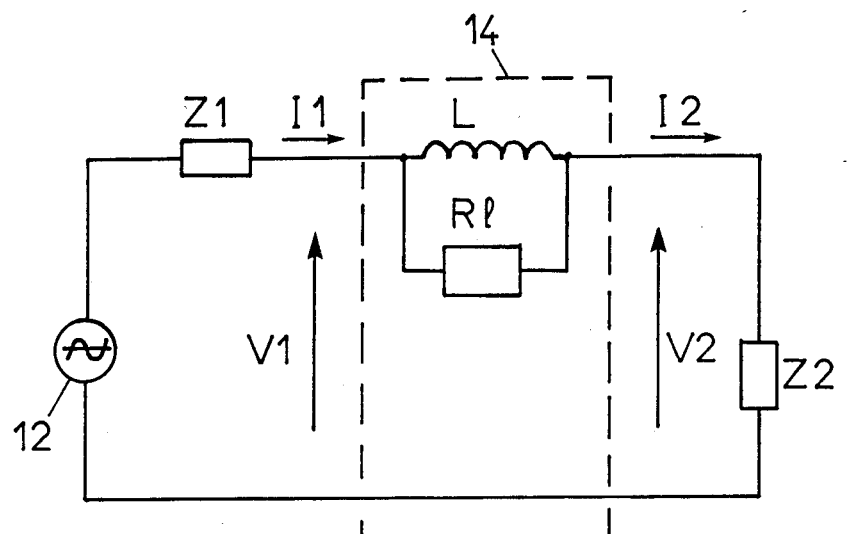
FIG. 2 represents a second type of dissipative low-pass filter.

Similarly, it can be shown that the ratio P2/P1 can reach the value 1, if Z2 can take any value having a positive real part (R2) for frequencies higher than the cutoff frequency, when $R1 << \omega L$, in the case of the dissipative low-pass filter 14 represented in FIG. 2, formed by a series branch RL, comprising an inductor L in parallel with a resistor R1, arranged in series with the load impedance Z2. In this case, we have in fact $$\frac{P2}{P1} = \frac{R2}{R1 + R2} \quad (5)$$

and $R3 = R1 + R2$ and $X3 = X2$ (6)

In this filter, if R2 is very great in comparison with R1, P2 is close to P1.

Thus, in the two circumstances set out above, i.e. when R2 is nil for the filter in FIG. 1 and when R2 is very great in comparison with R1 for the filter in FIG. 2, the proposed filters present a nil insertion loss. The use of such filters therefore does not provide a solution to the problem encountered in the case of non-dissipative filters.

Figure 3:
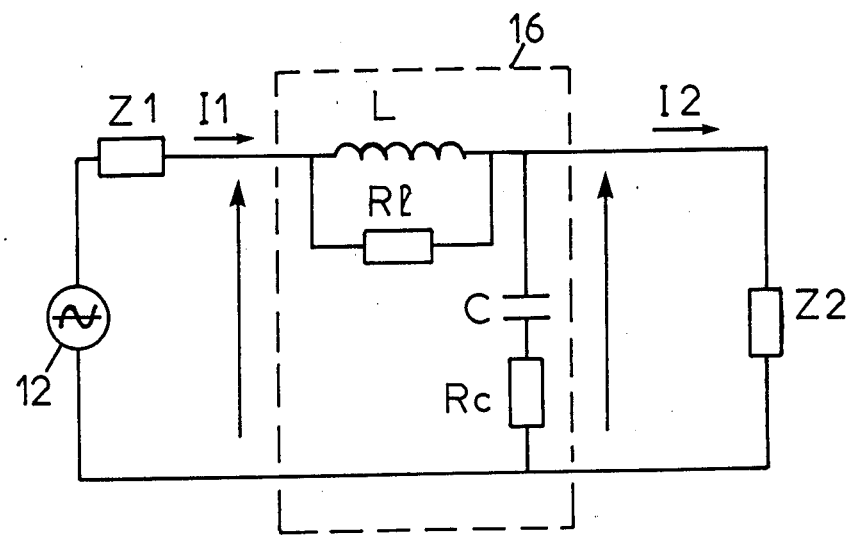
FIG. 3 represents a dissipative low-pass filter according to the invention.

FIG. 3 represents a dissipative low-pass filter 16 according to the invention. This filter comprises, in combination, a series RL branch and a parallel RC branch. It can be shown that for high frequencies, for which $Rc >> 1/\omega C$ and $R1 << \omega L$, we obtain:

$$\frac{P2}{P1} \leq 1 - 2\frac{R1}{Rc}\left(\sqrt{1 + \frac{Rc}{R1}} - 1\right) \quad (7)$$

Thus, not only the ratio P2/P1 has a maximum value strictly less than 1, but this maximum value is independent of the load impedance and depends only on the respective values of Rc and R1. It can therefore be fixed when the filter is manufactured.

At the same time, when $Rc >> 1/\omega C$ and $R1 << \omega L$, the real part R3 and the imaginary part X3 of the input impedance Z3 of the filter verify the following equations:

$$R1 \leq R1 + \frac{Rc\,R1}{Rc + R1} \leq R3 \leq R1 + Rc \quad (8)$$

$$\text{and } 0 \leq X3 \leq \mathrm{Inf}\left(\frac{Rc^2}{2(Rc+R2)}, \frac{|X2|\,Rc^2}{(Rc+R2)^2}\right) \leq \frac{Rc}{2} \quad (9)$$

The minimum attenuation M of the filter is given by:

$$M = -10\log_{10}\left[1 - 2\frac{R1}{Rc}\left(\sqrt{1 + \frac{Rc}{R1}} - 1\right)\right] \quad (10)$$

If $R1/Rc >> 1$, which is preferable, we obtain:

$$M \simeq 10\log_{10}\left(4\frac{R1}{Rc}\right) \quad (11)$$

We can thus determine in advance the minimum attenuation of the filter at a high frequency, by choosing the values of R1 and Rc.

For example, for a minimum attenuation of 16 dB, we will have 4 R1/Rc=40, i.e. R1/Rc=10.

To give an example, a filter was achieved with the following values:
L=1 mH
C=5 μF
R1=39 Ohms
Rc=3.9 Ohms.

It should be noted that in the pass band, for sufficiently low frequencies so that $Rc << 1/\omega C$ and $R1 >> \omega L$, the losses in the filter become negligible and the equations 7 to 10 are no longer applicable; the characteristics of the filter are once more defined by the reaction elements L and C.

The values of L, C, R1 and Rc are calculated in such a way as to fix a minimum attenuation M according to the equation (10), to comply with the equations $R1 << \omega L$ and $Rc >> 1/\omega C$ for a predetermined minimum frequency (10 KHz for instance) above which we want to observe the behaviour of the filter according to the equation (10), and to determine the characteristics of the filter inside the pass band. We therefore obtain in this way, for a low-pass filter designed to let the mains frequency (50 Hz or 60 Hz) pass, a predetermined minimum attenuation, independent of the source and load impedances, at high frequencies, in practice above 10 KHz.

The typical values of M which can be obtained with a filter 16 such as the one described in FIG. 3 range from 10 to 30 dB. To obtain higher attenuations requires the cascading of several filters, as represented in FIG. 4.

Figure 4:
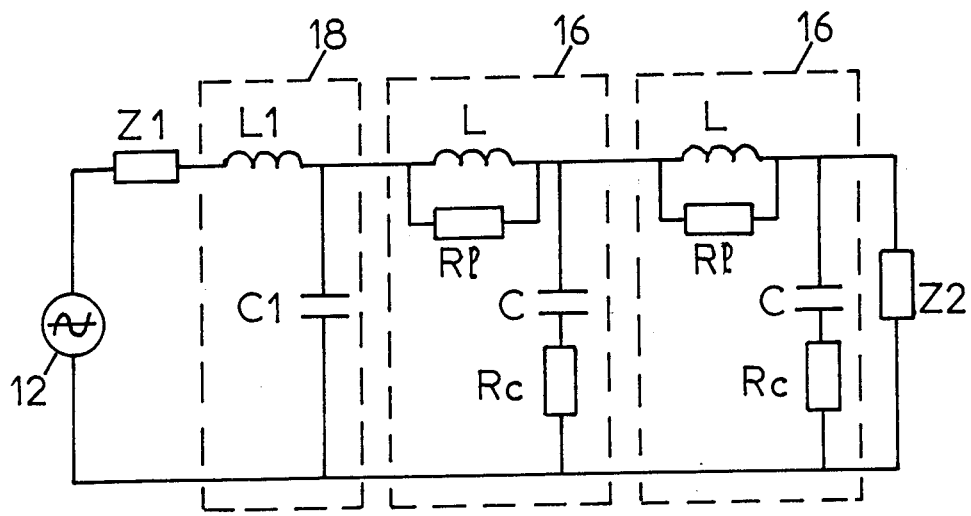
FIG. 4 represents a dissipative low-pass filter using the principles of the present invention.

One or more dissipative filters 16 according to the invention can also be used in cascading in combination with a non-dissipative filter 18, as represented in FIG. 4. The latter filter, comprising a series branch L1 and a parallel branch C1 is, for example, disposed between the source to be filtered and a first dissipative filter 16. The filters 16 then serve the purpose of fixing the load impedance seen by the non-dissipative filter 18 which can thus be used whatever the load impedance Z2.

A filter such as the one represented in FIG. 4 has been achieved, in which R1=39 Ohms and Rc=3.9 Ohms.

It can be shown that for high frequencies, that is to say when: 39 Ohms $>> \omega L$ and 3.9 Ohms $>> 1/\omega C$, the attenuation of the last filter 16 is at least 16 dB, according to the formula (11) It can also be shown that the attenuation of the two cascading dissipative filters 16 is at least 36 dB.

Furthermore, according to the formulas (8) and (9), the real part of the input impedance of the last filter 16 is within the 39 Ohms to 43 Ohms range, whereas the imaginary part of this impedance is within the −2 Ohms and 2 Ohms range. The real part of the input impedance of the intermediate filter 16 is then comprised between 42.6 Ohms to 43 Ohms, the imaginary part of this impedance being comprised between −0.017 Ohms and 0.017 Ohms. The latter impedance constitutes the load impedance of the non-dissipative filter 18 which therefore sees an impedance of approximately 43 Ohms, whatever the load impedance Z2. The non-dissipative filter 18 will then be able to be calculated in a conventional manner taking this load impedance into account.

The insertion loss of the dissipative filter 16 being, for high frequencies, independent of the source and load impedances, such a filter is less advantageous than a non-dissipative filter when the load and source have impedances of 50 Ohms, the latter being able under these conditions to supply a much greater attenuation than that of the dissipative filter. It is therefore worthwhile combining the two types of filters in a single filter, as represented in FIG. 4, the dissipative filter 16 acting as an impedance matching device for the non-dissipative filter 18 which can be designed in such a way as to supply a greater attenuation than that of the dissipative filter 16, at high frequencies.

The filter according to the invention can be used for filtering electrical power lines. It can, for example, be used as an input or output filter of an electronic power apparatus, in particular an uninterruptible power supply. If the filter is used to prevent interference feed-back from an uninterruptible power supply in the mains system, it is well known that the filtering problems arise within the 10 kHz to 30 MHz range, and more particularly between 10 kHZ and 200 kHz. The filter according to the invention, fitted at the input of the uninterruptible power supply, enables a minimum attenuation to be guaranteed over the whole frequency range.

I claim:

1. A dissipative low-pass filter comprising a first input, a second input, a first output and a second output, the second output being connected to said second input, said filter comprising a first branch located between said first input and said first output and formed by an inductance coil in parallel with a first resistor, and a second branch, located between said first output and said second output and formed by a capacitor in series with a second resistor, wherein the values of the inductance coil (L), of the capacitor (C) and of the resistors (R1) and (Rc) respectively in parallel with the inductance coil and in series with the capacitor being chosen whereby the minimum attenuation M of the filter, given by the relation $$M = -10 \log_{10}\left[1 - \frac{2R1}{Rc}\left(\sqrt{1 + \frac{Rc}{R1}} - 1\right)\right],$$

is fixed at a predetermined value, and whereby, for an angular frequency $\omega_o$ above which the filter must present said minimum attenuation, we have $$Rc >> \frac{1}{\omega_o C} \text{ and } R1 << \omega_o L,$$

the values of L and C also defining the characteristics of the filter inside the pass band.

2. A dissipative low-pass filter, comprising the cascading of several filters according to claim 1.

3. A dissipative low-pass filter, comprising a non-dissipative low-pass filter fitted in cascade with at least one dissipative low-pass filter according to claim 1.

* * * * *